(12) United States Patent
Kou et al.

(10) Patent No.: US 6,184,115 B1
(45) Date of Patent: Feb. 6, 2001

(54) METHOD OF FABRICATING SELF-ALIGNED SILICIDE

(75) Inventors: Hung-Yu Kou, Hsinchu Hsien; Chih-Ching Hsu, Hsinchu, both of (TW)

(73) Assignee: United Semiconductor Corp., Hsinchu (TW)

( * ) Notice: Under 35 U.S.C. 154(b), the term of this patent shall be extended for 0 days.

(21) Appl. No.: 09/250,618

(22) Filed: Feb. 16, 1999

(30) Foreign Application Priority Data

Jan. 4, 1999 (TW) .................................. 88100007

(51) Int. Cl.[7] .................................. H01L 21/3205
(52) U.S. Cl. .................................. 438/586; 438/586
(58) Field of Search .................................. 438/151, 300, 438/582, 583, 682, 655, 677, 683, 586, 674, 678

(56) References Cited

U.S. PATENT DOCUMENTS

| | | | | |
|---|---|---|---|---|
| 5,902,125 | * | 5/1999 | Wu ........................................ | 438/300 |
| 5,953,616 | * | 9/1999 | Ahn ....................................... | 438/305 |
| 5,994,747 | * | 11/1999 | Wu ........................................ | 257/408 |
| 6,008,077 | * | 12/1999 | Maeda ................................... | 438/151 |
| 6,015,752 | * | 1/2000 | Xiang et al. .......................... | 438/655 |
| 6,015,753 | * | 1/2000 | Lin et al. .............................. | 438/682 |
| 6,022,795 | * | 2/2000 | Chen et al. ........................... | 438/586 |

\* cited by examiner

Primary Examiner—David Nelms
Assistant Examiner—David Nhu
(74) Attorney, Agent, or Firm—Jiawei Huang; J. C. Patents

(57) ABSTRACT

The present invention is directed towards a method of fabricating a self-aligned silicide on gate electrode and source/drain region of a semiconductor device. A semiconductor substrate having gate oxide layer and polysilicon layer is provided. Next, a first silicide layer is formed on polysilicon layer. The substrate is patterned and then, etched to form a gate structure. A spacer is formed on the sidewall of the gate structure and source/drain region is formed adjacent thereto. A metal layer is covered on the surface of the substrate. The substrate is performed a thermal process to convert the portion of the metal layer on gate structure and source/drain region into self-aligned silicide.

24 Claims, 4 Drawing Sheets

METHOD OF FABRICATING SELF-ALIGNED SILICIDE

CROSS-REFERENCE TO RELATED APPLICATION

This application claims the priority benefit of Taiwan application serial no. 88100007, filed Jan. 4, 1999, the full disclosure of which is incorporated herein by reference.

BACKGROUND OF THE INVENTION

1. Field of the Invention

The invention relates to a method of fabricating an integrated circuit, and more particularly to a method of fabricating a self-aligned silicide on gate electrode and source/drain region of a semiconductor device.

2. Description of the Related Art

As the integration of the semiconductor devices in integrated circuits is increased more and more, the dimensions thereof, such as pattern and line-width, is reduces to less and less. However, the reduced line-width of the semiconductor devices results in the increased resistance of the wiring line between polysilicon electrode and devices and therefore, the RC delay is increased. In this circumstance, the operation rate of the semiconductor devices is adversely affected. Since the resistance of the silicide is lower than that of polysilicon and the thermal stability thereof is higher than that of common material for interconnect, such as aluminum, a salicide is formed at the interface between the gate electrode and the drain/source region and between the interconnects for reducing the sheet resistance of the drain/source region and completing the shallow junction between the metal and metal oxide semiconductor (MOS). In the conventional manufacture process, at least one metal layer is formed on silicon substrate and then, conducted a thermal process to convert the metal layer into a salicide. Alternatively, the salicide is directly covered on the substrate. The former is commonly used in the current manufacture of semiconductor devices. FIGS. 1A to 1C are schematic, cross-sectional view illustrating of fabrication of self-aligned silicide according to the conventional method.

Referring to FIG. 1A, a gate electrode including a patterned gate oxide layer 102 and polysilicon layer 104 is provided on a semiconductor substrate 100. A spacer 106 is formed at the sidewall of the gate electrode and drain/source 108 is formed adjacent to the gate electrode. A titanium layer 110 is sputtered on the substrate by DC Magnetron Sputtering process to cover the gate electrode, space 106 and source/drain 108. Then, a titanium nitride layer 112 is formed on titanium layer 110 as passivation layer.

Referring to FIG. 1B, the substrate with metal layer 110 and passivation layer 112 is conducted a rapid thermal process at a temperature of 600° C. to 650° C. In this condition, the portion of the metal layer 110 which contacts with the silicon, such as the polysilicon layer 104 and source/drain 108, is reacted with the silicon in polysilicon layer 104, source/drain 108 to form a salicide 114 of C-49 TiSi$_2$ and the portion of the metal layer 110 which does not contact with the silicon will not convert into salicide. This process is named self-aligned fabrication of salicide.

The passivation layer 112 and remaining metal layer 110 are removed in sequence, as shown in FIG. 1C. The substrate 100 with salicide 114 is treated a second rapid thermal process at a temperature of 700° C. to 750° C. Under this condition, the C-49 type titanium silicide in salicide 114 formed on the surface of the polysilicon 114 and source/drain 108 converts into C-54 type titanium silicide to complete the fabrication of the salicide, wherein the impedance of the former is higher than that of the latter.

However, since the geometry and linewidth effects of the gate electrode, the formation of the salicide on the gate electrode is limited. The thickness of the salicide on the polysilicon layer of gate electrode is thinner that that of the source/drain due to the different rate of the formation thereof. Therefore, the salicide formed on the substrate is un-uniform and thus, affects the contact resistance of the interconnects and the performance of the gate electrode.

In conventional, an approach is to use higher operative temperature and longer reaction time for thermal process to improve the uniformity of the salicide on the polysilicon layer of the gate electrode. However, this thermal process results in the diffusion of the silicon from the source/drain 108 and polysilicon layer 104 of the substrate 100 to the surface of spacer 106. Thus, a lateral growth issue of salicide occurs on the surface of spacer 106, which results in undesired short, bridging and leakage between the gate electrode and source/drain. To avoid the lateral growth issue occurs, an approach using lower operative temperature for thermal process is proposed. However, the thickness and the quality of the salicide formed in this process is unsatisfied.

Therefore, there is a need to provide a process of fabricating self-aligned silicide with uniformity of thickness without electrical short, bridging and leakage occurring between the gate electrode and source/drain.

SUMMARY OF THE INVENTION

It is therefore an object of the invention to provide a method of fabricating salicide on gate electrode and source/drain region on a semiconductor substrate, in which no electrical short, bridging and leakage occurring between the gate electrode and source/drain region.

It is another object of the present invention to provide a method of fabricating a salicide on gate electrode of a semiconductor substrate with uniformity of thickness.

Accordingly, the present invention is directed towards a method of fabricating a self-aligned silicide on gate electrode and source/drain region of a semiconductor substrate. A semiconductor substrate having gate oxide layer and polysilicon layer is provided. Next, a first silicide layer is formed on the polysilicon layer. The substrate is patterned and then, etched to form a gate structure. A spacer is formed on the sidewall of the gate structure and source/drain region is formed adjacent thereto. A metal layer is covered on the surface of the substrate. Then, the substrate is performed a first thermal process to convert the portion of the metal layer on gate structure and source/drain region into self-aligned silicide.

In one preferred embodiment of the method of the present invention, the thermal process for converting the portion of the metal layer on gate structure and source/drain region into self-aligned silicide is conducted at a temperature of about 600° C. to 650° C.

In one preferred embodiment of the method of the present invention, after converting the portion of the metal layer on gate structure and source/drain region into self-aligned salicide, remaining metal layer is removed and the substrate is treated a second thermal process at a temperature of about 700° C. to 750° C.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
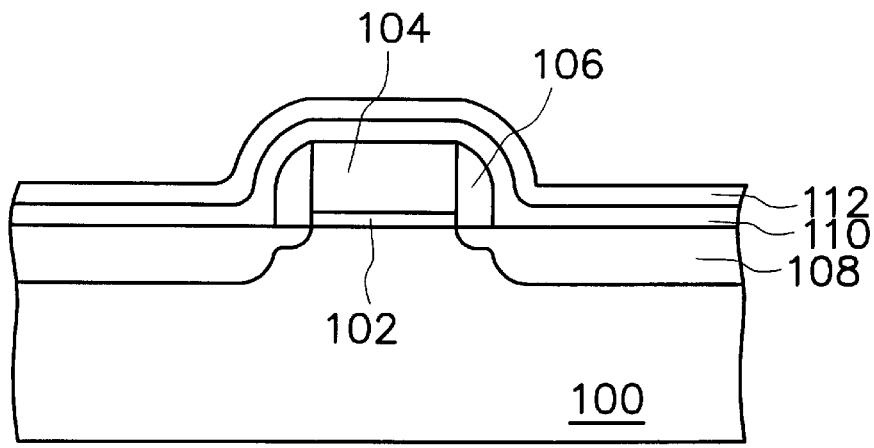
FIGS. 1A–1C are schematic, cross-sectional view illustrating of fabrication of salicide on gate electrode and source/drain region according to the conventional method.
Figure 1B:
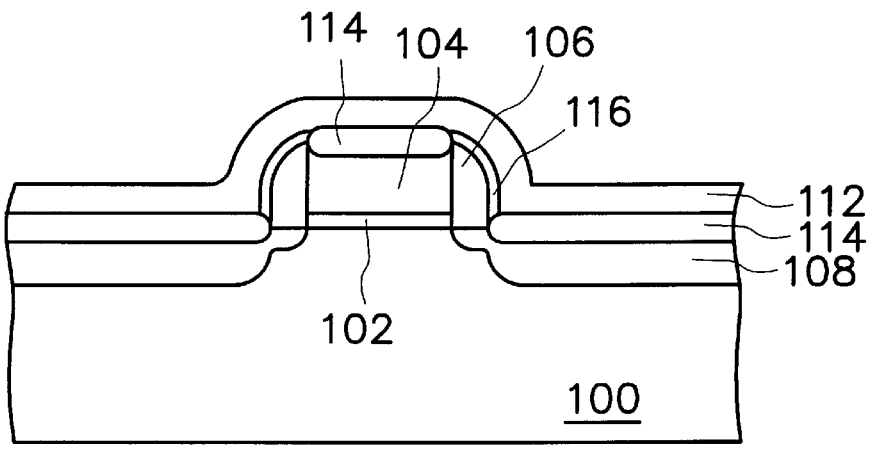
Figure 1C:
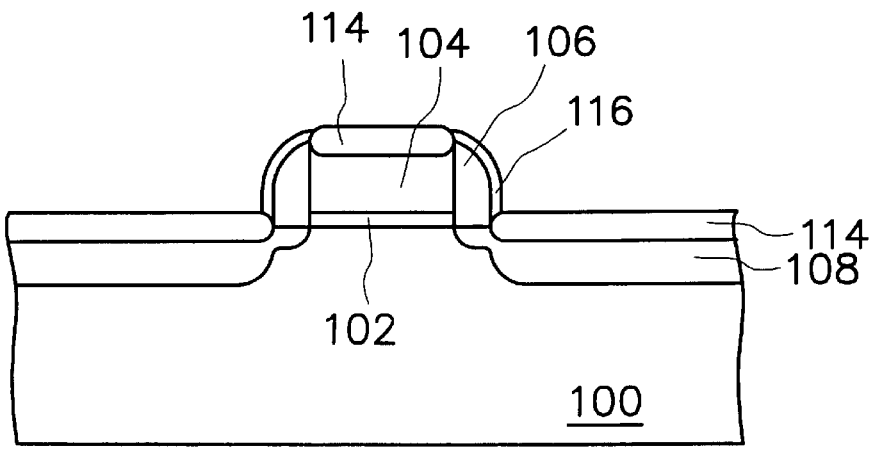
Figure 2A:
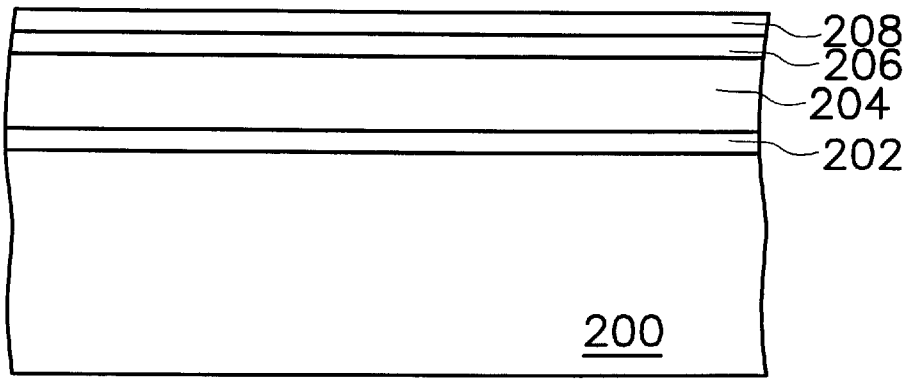
FIGS. 2A–2H are schematic, cross-sectional view illustrating of fabrication of salicide on gate electrode and source/drain region according to the method of the present invention.

Referring to FIG. 2A, a gate oxide layer 202 and polysilicon layer 204 are in sequence formed on a semiconductor substrate 200. Then, a first metal layer 206 and a passivation layer 208 are in sequence formed on polysilicon layer 204. The formation of the first metal layer 206 is formed for example by sputtering process, such as DC Magnetron Sputtering process. Suitable material for the first metal layer is for example titanium or cobalt. Suitable material for the passivation layer 208 is for example silicon oxide, silicon nitride or the combination thereof.

Figure 2B:
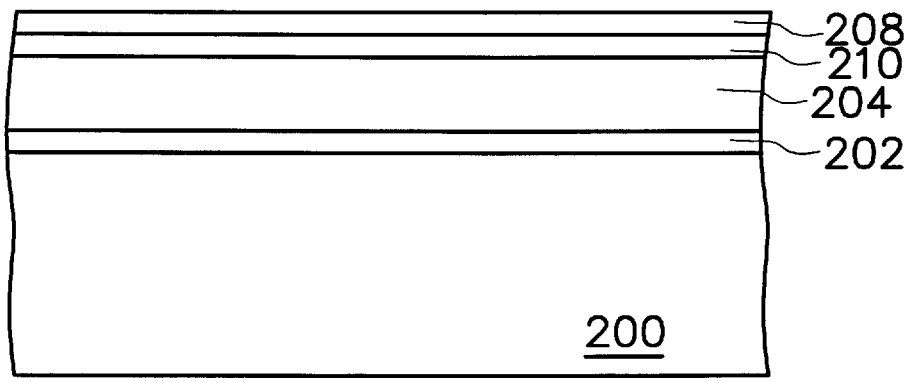

The substrate with the above stack structure is treated a primary thermal process for reacting the first metal layer 206 with polysilicon layer 204 to convert the first metal layer 206 into first silicide layer 210, as shown in FIG. 2B. The primary thermal process is preferably a rapid thermal process and conducted at a temperature from about 600° C. to 650° C. In case that the first metal layer is titanium, the first silicide layer 210 is C-49 titanium silicide with about 60 to 90 micro-ohm/cm of resistivity. Since the first silicide layer 210 is formed before the definition of the gate electrode, the silicide layer will not affected by geometry or linewidth thereof. Furthermore, the time for formation of silicide layer 210 is short.

Figure 2C:
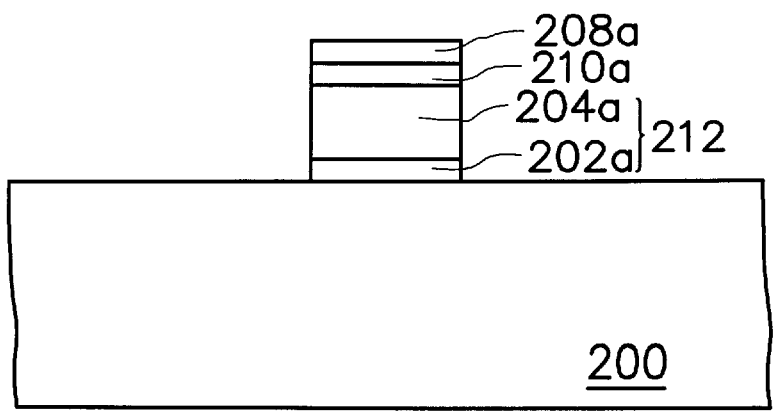

Referring to FIG. 2C, a gate structure is formed by patterning and etching process, which comprises gate oxide layer 202a, polysilicon layer 204a, silicide layer 210a and passivation layer 208a, wherein the gate oxide layer 202a and polysilicon layer 204a are composed as a gate electrode 212.

Figure 2D:
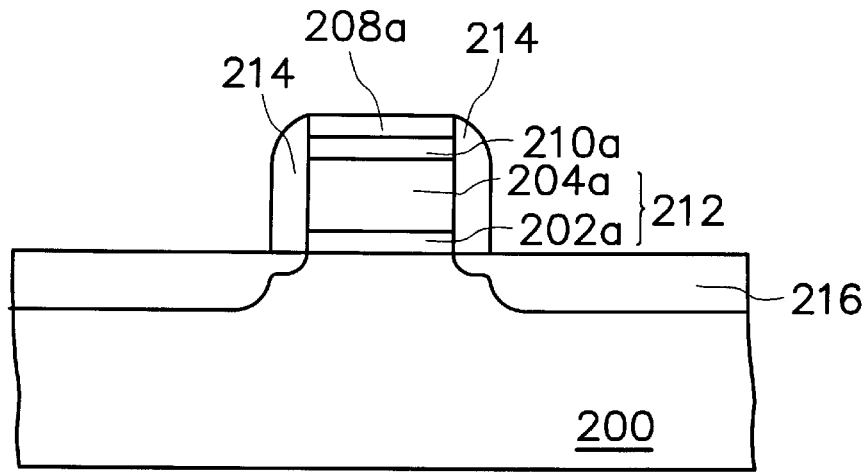

Source/drain region is formed adjacent to the gate structure and spacers 213 are formed on the sidewall thereof, as shown in FIG. 2D. The source/drain region is formed by a known process, such as ion implantation comprising the steps of ion implanting with light dopants into the substrate 200 by use the gate structure as a mask to form a light source/drain region; forming spacers; and further ion implanting with heavy dopants into the substrate 200 by use the gate structure and spacers together as a mask for a heavy source/drain region. The light and heavy source/drain region together form the source/drain region.

Figure 2E:
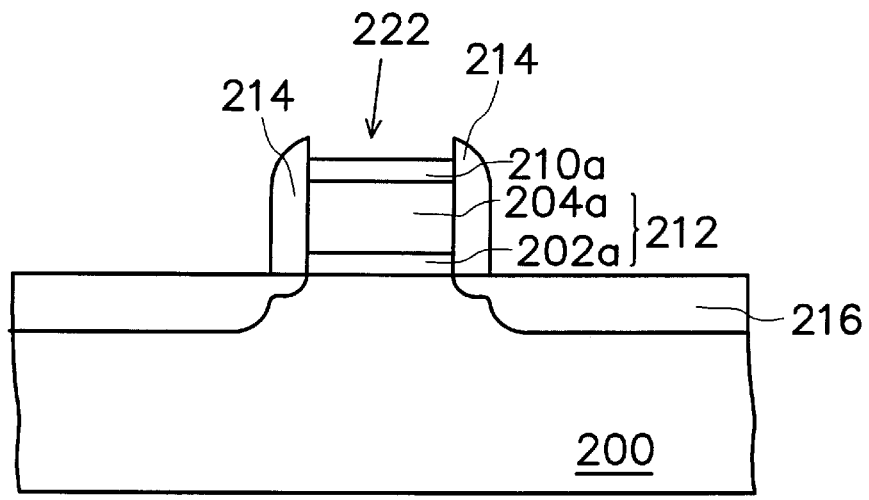

Next, the passivation layer 208a is removed to expose the surface of the silicide layer 210a. After removal of the passivation layer 208a, the spacers and the gate silicide layer 210a together form a recess 222 on the gate structure, as shown in FIG. 2E.

Figure 2F:
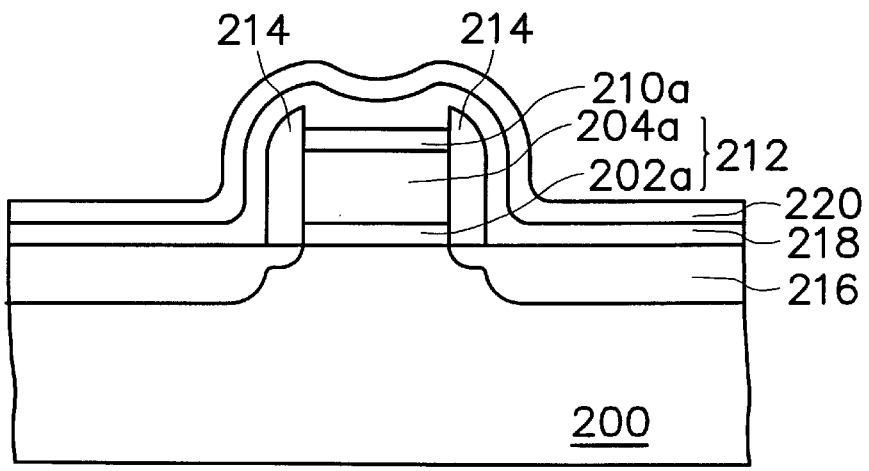

Referring to FIG. 2F, a second metal layer 218 and a second passivation layer 220 are in sequence formed on the surface of the substrate 200 and fill in recess 222. The second metal layer 218 is formed for example by sputtering process, such as DC Magnetron Sputtering process. Suitable material for the second metal layer 218 is for example titanium or cobalt. The second passivation layer 220 is used to prevent the second metal layer 218 from un-uniform formation of titanium silicide during the subsequent thermal process. Suitable material for the second passivation layer 220 is for example titanium nitride.

Figure 2G:
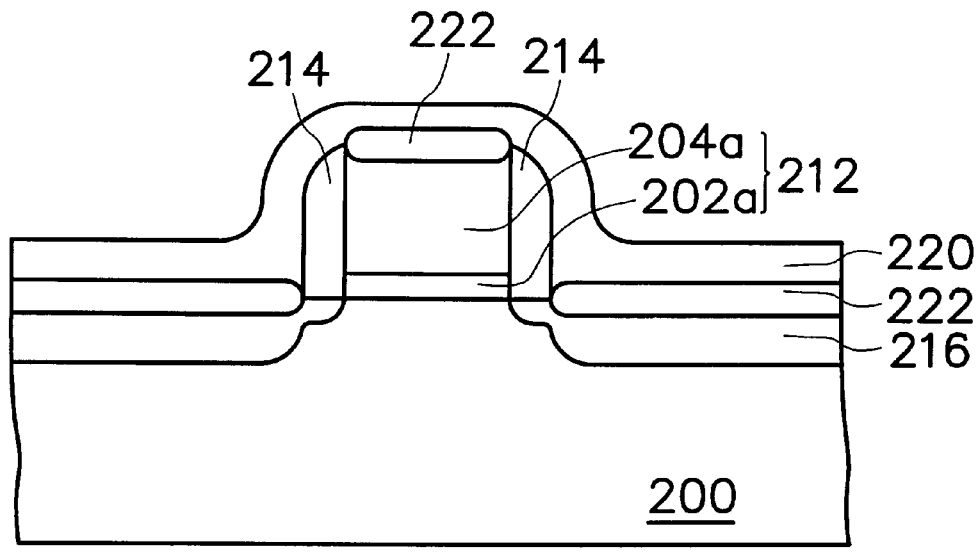
Figure 2H:
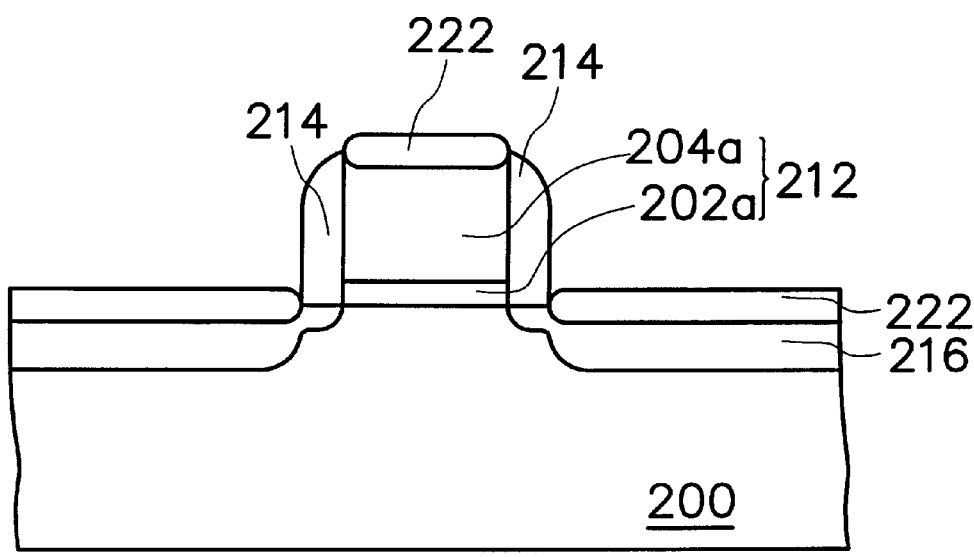

The substrate 200 is performed a first thermal process for converting the second metal layer covered on first silicide layer 204a and source/drain region into self-aligned silicide 222, as shown in FIG. 2G. In case that the second metal layer is titanium, the salicide comprises titanium silicide, such as C-49 titanium silicide. In case that the second metal layer is cobalt, the salicide comprises cobalt silicide. In a preferred embodiment to performance of the present invention, the first thermal process is conducted at a temperature of about 600° C. to 650° C.

Then, the second passivation layer 220 and remaining metal layer 218a are removed to expose the self-aligned silicide 222 and spacers 214. The process for removal of remaining metal layer 218a is for example wet etching process, such as wet etching with RCA solution comprising ammonium hydroxide ($NH_4OH$), hydro peroxide ($H_2O_2$) and hot deionized water. Next, a second thermal process is performed on the substrate 200 to densify the self-aligned silicide 222. The second thermal process is preferably a rapid thermal process and conducted at a temperature of about 700° C. to 750° C. In this condition, the C-49 salicide with about 60 to 90 micro-ohm/cm of resistivity converts into C-54 salicide with about 12 to 20 micro-ohm/cm of resistivity.

According to the method of the present invention for fabricating salicide on gate electrode and source/drain region of a semiconductor device, a first silicide is formed with the gate structure so that the thickness of the salicide on gate structure can be increased. Therefore, the reaction temperature of the thermal process for formation of salicide does not need to increase, so as to avoid the formation of the salicide on the spacer surface as happened in the conventional method. Furthermore, no lateral growth issue occurs during the formation of salicide on the gate structure and source/drain region of the semiconductor device.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a self-aligned silicide on a gate electrode and source/drain regions of a semiconductor device, comprising the steps of:

providing a semiconductor substrate having a gate oxide layer and a polysilicon layer;

forming a first metal layer and a first passivation layer in sequence on the polysilicon layer;

performing a primary thermal process to convert the first metal layer into a first silicide layer;

defining the substrate to form a gate structure;

forming a spacer on a sidewall of the gate structure;

forming a second metal layer and a second passivation layer in sequence on the surface of the substrate;

performing a first thermal process to convert a portion of the second metal layer on the gate structure and on source/drain regions into self-aligned silicide.

2. The method as claimed in claim 1, wherein the first metal layer is formed by DC Magnetron Sputtering process.

3. The method as claimed in claim 1, wherein the material for the first passivation layer is selected form the group consisting of silicon oxide, silicon nitride and the combination thereof.

4. The method as claimed in claim 1, wherein the primary thermal process is a rapid thermal process.

5. The method as claimed in claim 1, wherein the primary thermal process is conducted at a temperature of about 600° C. to 650° C.

6. The method as claimed in claim 1, further comprising a step of removing the first passivation layer from the gate structure after the formation of the gate structure.

7. The method as claimed in claim 1, wherein the second metal layer is formed by DC Magnetron Sputtering process.

8. The method as claimed in claim 1, wherein material for the second passivation layer is silicon nitride.

9. The method as claimed in claim 1, wherein the first thermal process is a rapid thermal process.

10. The method as claimed in claim 1, wherein the first thermal process is conducted at a temperature of about 600° C. to 650° C.

11. The method as claimed in claim 1 further comprising the steps of removing the second passivation layer and remaining second metal layer; and performing a second thermal process.

12. The method as claimed in claim 11, wherein the second thermal process is a rapid thermal process.

13. The method as claimed in claim 12, wherein the second thermal process is conducted at a temperature of about 700° C. to 750° C.

14. A method of fabricating a self-aligned silicide on a gate electrode and source/drain regions of a semiconductor device, comprising the steps of providing a semiconductor substrate having a gate oxide layer and a polysilicon layer;

forming a silicide layer on the polysilicon layer;

defining the substrate to form a gate structure;

forming a spacer on a sidewall of the gate structure;

forming a metal layer on the surface of the substrate;

performing a first thermal process to convert a portion of the metal layer on the gate structure and on source/drain regions into self-aligned silicide.

15. The method as claimed in claim 14, wherein the step of forming a silicide layer comprises the steps of forming a first metal layer on polysilicon layer; and performing a primary thermal process to convert the first metal layer into the silicide layer.

16. The method as claimed in claim 15, the first metal layer is formed by DC Magnetron Sputtering process.

17. The method as claimed in claim 15, wherein the primary thermal process is a rapid thermal process.

18. The method as claimed in claim 15, wherein the primary thermal process is conducted at a temperature of about 600° C. to 650° C.

19. The method as claimed in claim 14, wherein the first metal layer is formed by DC Magnetron Sputtering process.

20. The method as claimed in claim 14, wherein the first thermal process is a rapid thermal process.

21. The method as claimed in claim 14, wherein the first thermal process is conducted at a temperature of about 600° C. to 650° C.

22. The method as claimed in claim 14 further comprising the steps of removing the remaining second metal layer; and performing a second thermal process.

23. The method as claimed in claim 22, wherein the second thermal process is a rapid thermal process.

24. The method as claimed in claim 22, wherein the second thermal process is conducted at a temperature of about 700° C. to 750° C.

* * * * *